US006368904B1

(12) United States Patent
Yamazaki

(10) Patent No.: US 6,368,904 B1
(45) Date of Patent: *Apr. 9, 2002

(54) SEMICONDUCTOR DEVICE AND METHOD OF MANUFACTURING THE SAME

(75) Inventor: Shunpei Yamazaki, Tokyo (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/566,480

(22) Filed: May 8, 2000

Related U.S. Application Data

(62) Division of application No. 09/119,779, filed on Jul. 21, 1998, now Pat. No. 6,066,518.

(30) Foreign Application Priority Data

Jul. 22, 1997 (JP) .............................................. 9-212466

(51) Int. Cl.[7] .............................................. H01L 21/84
(52) U.S. Cl. .......................... 438/166; 438/486; 257/66
(58) Field of Search ................................. 438/166, 486; 257/66

(56) References Cited

U.S. PATENT DOCUMENTS

| | | | |
|---|---|---|---|
| 5,403,772 A | 4/1995 | Zhang et al. | 438/166 |
| 5,426,064 A | 6/1995 | Zhang et al. | 438/166 |
| 5,481,121 A | 1/1996 | Zhang et al. | 257/64 |
| 5,488,000 A | 1/1996 | Zhang et al. | 438/166 |
| 5,492,843 A | 2/1996 | Adachi et al. | 438/479 |
| 5,501,989 A | 3/1996 | Takayama et al. | 438/155 |
| 5,508,533 A | 4/1996 | Takemura | 257/64 |
| 5,512,494 A * | 4/1996 | Tanabe | 438/166 |
| 5,529,937 A | 6/1996 | Zhang et al. | 438/471 |
| 5,534,716 A | 7/1996 | Takemura | 257/72 |
| 5,543,352 A | 8/1996 | Ohtani et al. | 438/487 |
| 5,563,426 A | 10/1996 | Zhang et al. | 257/66 |
| 5,569,610 A | 10/1996 | Zhang et al. | 438/166 |
| 5,569,936 A | 10/1996 | Zhang et al. | 257/66 |
| 5,580,792 A | 12/1996 | Zhang et al. | 438/166 |
| 5,585,291 A | 12/1996 | Ohtani et al. | 438/486 |
| 5,589,694 A | 12/1996 | Takayama et al. | 257/67 |
| 5,595,923 A | 1/1997 | Zhang et al. | 438/162 |
| 5,595,944 A | 1/1997 | Zhang et al. | 438/158 |
| 5,604,360 A | 2/1997 | Zhang et al. | 257/72 |
| 5,605,846 A | 2/1997 | Ohtani et al. | 438/487 |
| 5,606,179 A | 2/1997 | Yamazaki et al. | 257/59 |
| 5,608,232 A | 3/1997 | Yamazaki et al. | 257/66 |
| 5,612,250 A | 3/1997 | Ohtani et al. | 438/795 |
| 5,614,426 A | 3/1997 | Funada et al. | 438/150 |
| 5,614,733 A | 3/1997 | Zhang et al. | 257/66 |
| 5,616,506 A | 4/1997 | Takemura | 438/150 |
| 5,620,910 A | 4/1997 | Teramoto | 438/151 |
| 5,621,224 A | 4/1997 | Yamazaki et al. | 257/66 |

(List continued on next page.)

OTHER PUBLICATIONS

T–J. King et al., A Low–Temperature (□ 550 □C) Silicon –Germanium MOS Thin–Film Transistor Technology for Large–Area Electronics. 1991 IEEE, pp. 567–570.*
R. Reif et al., Silicon–Germanium Polycrystalline Films for TFT Applications. 1994 EDMS, pp. 2.4.13–2.4.16.*

*Primary Examiner*—Olik Chaudhuri
*Assistant Examiner*—Anh Duy Mai
(74) *Attorney, Agent, or Firm*—Eric J. Robinson; Nixon Peabody LLP

(57) ABSTRACT

In a method of manufacturing a semiconductor device, an insulating film having an opening is formed on an amorphous film 103 containing silicon therein. After catalytic elements are introduced from the opening, the amorphous film 103 is crystallized. Thereafter elements (phosphorus) selected from Group XV are introduced from the opening, and then a heat treatment is conducted to obtain a film having crystallinity. Thereafter, a portion of the film containing silicon into which the catalytic elements and phosphorus is introduced are removed.

73 Claims, 9 Drawing Sheets

U.S. PATENT DOCUMENTS

| | | | |
|---|---|---|---|
| 5,624,851 A | 4/1997 | Takayama et al. | 438/166 |
| 5,637,515 A | 6/1997 | Takemura | 438/162 |
| 5,639,698 A | 6/1997 | Yamazaki et al. | 438/486 |
| 5,643,826 A | 7/1997 | Ohtani et al. | 438/162 |
| 5,646,424 A | 7/1997 | Zhang et al. | 257/66 |
| 5,654,203 A | 8/1997 | Ohtani et al. | 438/97 |
| 5,656,825 A | 8/1997 | Kasumoto et al. | 257/66 |
| 5,663,077 A | 9/1997 | Adachi et al. | 438/151 |
| 5,677,549 A | 10/1997 | Takayama et al. | 257/66 |
| 5,696,386 A | 12/1997 | Yamazaki | 257/57 |
| 5,696,388 A | 12/1997 | Funada et al. | 257/64 |
| 5,700,333 A | 12/1997 | Yamazaki et al. | 136/258 |
| 5,705,829 A | 1/1998 | Miyanaga et al. | 257/66 |
| 5,712,191 A | 1/1998 | Nakajima et al. | 438/487 |
| 5,744,824 A | 4/1998 | Kousai et al. | 257/74 |
| 6,066,518 A * | 5/2000 | Yamazaki | 438/166 |
| 6,156,590 A * | 12/2000 | Yamazaki et al. | 438/166 |

* cited by examiner

Heat Treatment for Gettering

Gettering by Addition of Halogen Element Gas

Heat Treatment for Gettering

Gettering in Oxidizing Gas Added with Halogen Element Gas

Heat Treatment for Gettering

Dry Etching

HCl Thermal Oxidation

Addition of Impurity Ion for Giving N-type
(Formation of n-/n+)

Addition of Impurity Ion for Giving P-type
(Formation of p-/p+)

N channel TFT        P channel TFT

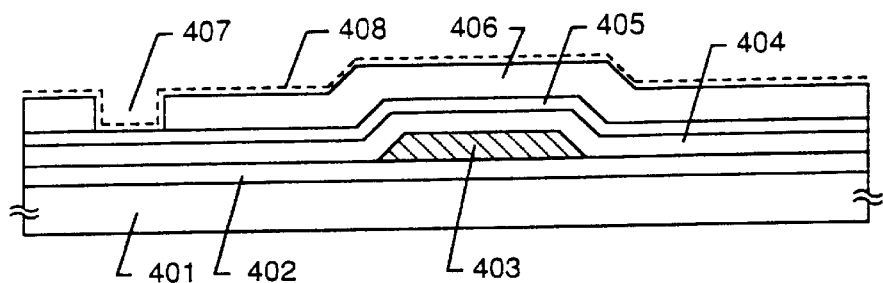
Fig. 7A
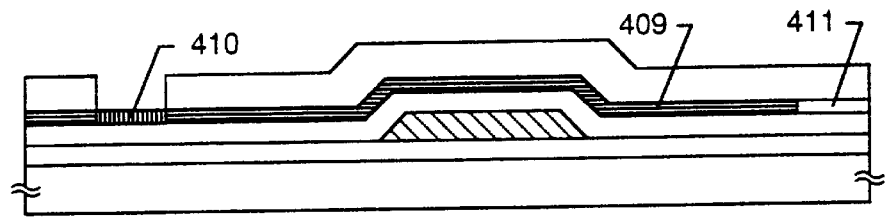
Fig. 7B
Addition of P ion
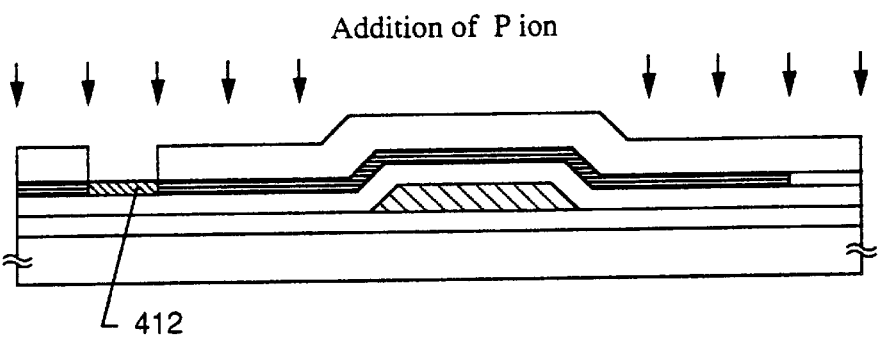
Fig. 7C
Heat Treatment for Getteing
Fig. 7D
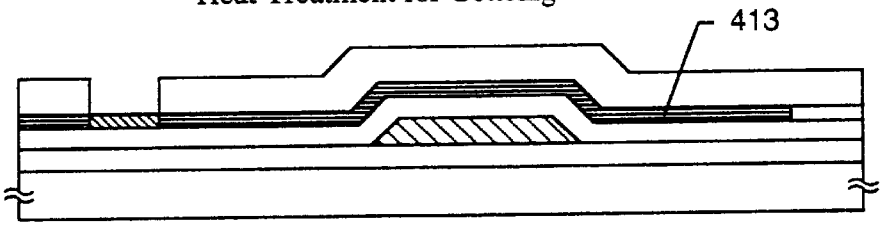
Fig. 7E
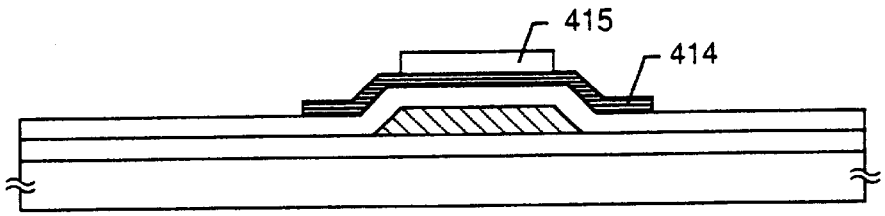
Fig. 7F
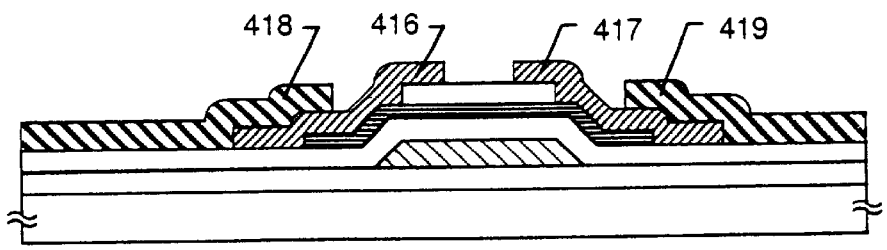

CMOS circuit | Pixel TFT

SEMICONDUCTOR DEVICE AND METHOD OF MANUFACTURING THE SAME

This application is a Divisional of Application Ser. No. 09/119,779 filed Jul. 21,1998 now U.S. Pat. No. 6,066,518.

BACKGROUND OF THE INVENTION

1. Field of the Invention

The present invention relates to a method of manufacturing a semiconductor device using a semiconductor thin film, and more particularly to a method of manufacturing a thin film transistor (TFT) using a crystalline silicon film.

In the present specification, the semiconductor device is directed to all of devices that function using semiconductor, and includes not only a single device such as a TFT but also an electro-optic device, an electronic device on which the electro-optic device is mounted, etc.

2. Description of the Related Art

In recent years, thin film transistors used in an electro-optic device such as an active matrix liquid crystal display device have been actively developed.

The active matrix liquid crystal display device is directed to a monolithic display device having a pixel matrix circuit and a driver circuit on the same substrate. Also, a system on-panel in which a logic circuit such as a memory circuit or a clock generating circuit is built has been progressively developed.

Since the driver circuit and the logic circuit of the above type require high-speed operation, it is improper to use an amorphous silicon film as an active layer. For that reason, in the existing circumstances, a TFT using a crystalline silicon film (polysilicon film) as an active layer is being mainly used.

The present inventors disclose a technique in Japanese Patent Unexamined Publication No. Hei 8-78329 as a technique for obtaining a crystalline silicon film on a glass substrate. The technique disclosed in that publication is that catalytic elements that promote crystallization are selectively added to an amorphous silicon film, and a heat treatment is then conducted on the film to form a crystalline silicon film that spreads frown a catalytic element added region as a starting point.

This technique makes it possible to lower the crystallization temperature of the amorphous silicon film down to 50 to 100° C. due to the action of the catalytic elements, and also makes it possible to reduce a period of time required for crystallization down to ⅕ to 1/10. Further, because the crystallization of a silicon film progresses laterally substantially in parallel with a substrate surface, the present inventors call this crystallization region "lateral growth region".

Since the catalytic elements are not directly added to the lateral growth region, the catalytic elements remaining in the film is less than that in the case where the catalytic elements are directly added. For example, in the case of directly adding the catalytic elements, the catalytic elements are contained in the film in the orders of $10^{19}$, but in case of the lateral growth region, the orders in which the catalytic elements are contained are $10^{18}$ which is reduced one digit.

The above crystallizing technique enables a silicon film having excellent crystallinity to be obtained at a relatively low temperature. However, since the catalytic elements are contained in the film, to control the amount of introducing the catalytic elements is delicate, thereby leading to a problem on reproducibility and stability (stability of the electric characteristics of an obtained device).

Also, an influence of the catalytic elements remaining in the film cause such problems that the characteristics of the obtained semiconductor device are varied as a time elapses, that an off-state value which is a characteristic value of the thin-film transistor is large.

As the catalytic elements used for promoting the crystallization, there are used metal elements such as nickel or cobalt, and if the catalytic elements are even slightly contained in the film, they adversely affect the electric characteristic and the reliability of the TFT.

Accordingly, it is ideally desirable that the catalytic elements are perfectly removed from the film after a crystallizing process.

Under the above circumstances, in order to reduce the concentration of catalytic elements existing in the crystallized crystalline silicon film, elements selected from Group XV (15) are selectively added to the crystalline silicon film, and a heat treatment is conducted on that film-under an oxygen atmosphere, to thereby make the concentration of catalytic elements reduce. However, the catalytic elements cannot be completely removed from the interior or the surface of the film by only the above process, and also in a process of conducting a heat treatment on the crystalline silicon film in an oxygen atmosphere, the catalytic elements existing in the film react with oxygen to form an oxide, and there appears a phenomenon that the oxide abnormally grows on the surface and in the interior of the film.

The oxide that has abnormally grown has a size of several $\mu$m, and in the case of using a mask made of the oxide, because the oxide is removed together with the mask in a mask removing process for forming a semiconductor island region, holes are produced in the surface and interior of the film, thereby leading to the failure of the characteristic of the thin film transistor.

As described above, the oxide that abnormally grows causes a problem in forming a semiconductor island region.

SUMMARY OF THE INVENTION

The present invention has been made to solve the above problem, and therefore an object of the present invention is to provide a technique for preventing an oxide that abnormally grows from generating.

Another object of the present invention is to provide a technique for preventing the oxide that abnormally grows from generating, and removing catalytic elements existing in a crystallized crystalline silicon film to reduce the concentration of catalytic elements to a degree that the characteristic of a transistor is not affected by that concentration.

To achieve the above objects, according to one aspect of the present invention, there is provided a method of manufacturing a semiconductor device comprising the steps of:

selectively forming an insulating film on an amorphous silicon film;

selectively adding catalytic elements that promote the crystallization of silicon to the amorphous film with the insulating film as a mask;

transforming at least a part of the amorphous silicon film into a crystalline silicon film through a heat treatment;

selectively adding elements selected from Group XV to the crystalline silicon film with the insulating film as a mask;

gettering the catalytic elements to a region in which the elements selected from Group XV are added from a region adjacent to the region through a heat treatment; and removing only the region to which the elements selected from Group XV are added.

Also, according to another aspect of the present invention, there is provided a method of manufacturing a semiconductor device comprising the steps of:

selectively forming an insulating film on an amorphous silicon film;

selectively adding catalytic elements that promote the crystallization of silicon to the amorphous film with the insulating film as a mask;

transforming at least a part of the amorphous silicon film into a crystalline silicon film through a heat treatment;

selectively adding elements selected from Group XV to the crystalline silicon film with the insulating film as a mask;

gettering the catalytic elements to a region in which the elements selected from Group XV are added from a region adjacent to the region through a heat treatment; and removing only the region to which the elements selected from Group XV are added, and removing or reducing the catalytic elements existing in the crystalline silicon film and the elements selected from Group XV from a section where the region is removed, through a heat treatment in an atmosphere containing halogen elements therein.

Further, according to still another aspect of the present invention, there is provided a method of manufacturing a semiconductor device comprising the steps of:

selectively forming an insulating film on an amorphous silicon film;

selectively adding catalytic elements that promote the crystallization of silicon to the amorphous film with the insulating film as a mask;

transforming at least a part of the amorphous silicon film into a crystalline silicon film through a heat treatment;

selectively adding elements selected from Group XV to the crystalline silicon film with the insulating film as a mask;

gettering the catalytic elements to a region in which the elements selected from Group XV are added from a region adjacent to the region through a heat treatment;

removing a region to which the elements selected from Group XV are added; and removing or reducing the catalytic elements existing in the crystalline silicon film and the elements selected from Group XV, through a heat treatment in an oxidizing atmosphere containing halogen elements therein.

Furthermore, according to still another aspect of the present invention, there is provided a method of manufacturing a semiconductor device comprising the steps of:

selectively forming an insulating film on an amorphous silicon film;

selectively adding catalytic elements that promote the crystallization of silicon to the amorphous film with the insulating film as a mask;

transforming at least a part of the amorphous silicon film into a crystalline silicon film through a heat treatment;

selectively adding elements selected from Group XV to the crystalline silicon film with the insulating film as a mask;

gettering the catalytic elements to a region in which the elements selected from Group XV are added from a region adjacent to the region through a heat treatment;

removing a region to which the elements selected from Group XV are added;

patterning the crystalline silicon film to form an island region;

covering the island region with an insulating film; and conducting a heat treatment in an oxidizing atmosphere containing halogen elements therein.

It is desirable that the region to which the catalytic elements are added and the region to which the elements selected from Group XV are added are formed by the same insulating film mask.

A basic object of the present invention is to remove the catalytic elements used for crystallization of the amorphous film containing silicon from the crystalline film, and as means for achieving this object, there is used the gettering effect of the elements selected from Group XV.

The catalytic elements are representatively Ni (nickel), Co (cobalt), Fe (iron), Pd (palladium), Pt (platinum), Cu (copper), and Au (gold). According to the experiments of the present inventors, it is found that nickel is the most proper element.

The elements of Group XV which getters the catalytic elements are N (nitrogen), P (phosphorus), As (arsenic), Sb (antimony) and Bi (bismuth), and in particular, what exhibits remarkable action and effect is P (phosphorus).

The addition of the elements of Group XV may be made through the ion plantation method or the plasma doping method.

Those methods are different from each other in that the former method is to mass-separate only the element ions of a single substance to add them whereas the latter is to add also the composite ions containing elements without conducting mass-separation. For example, in the case where the plasma doping method is used for addition of P, since $PH_3$ (phosphine) is employed as a plasma doping gas, compound such as $PH_2$ or $PH_3$ are contained in the film in addition to P. However, elements that impedes the gettering effect are not contained in the film. The same is applied to other elements.

As a representative example, in the case where nickel and phosphorus are used as catalytic elements and gettering elements (elements of Group XV), respectively, phosphorus and nickel exhibit a stable bond state through a heat treatment at about 600° C. In this situation, there are bond states of $Ni_3P$, $Ni_5P_2$, $Ni_2P$, $Ni_3P_2$, $Ni_2P_3$, $NiP_2$ and $NiP_3$.

As described above, in the case where nickel is used as catalytic elements that promote the crystallization of an amorphous film containing silicon, nickel can be gettered by the action of phosphorus which is an element of Group XV. The use of this effect makes it possible to remove or reduce catalytic elements from the interior of the crystalline silicon film.

However, this gettering process is insufficient to remove nickel, and nickel slightly remains in the crystallize silicon film.

When remaining nickel is exposed to and reacts with oxidizing gas, nickel suicide is oxidized to produce an oxide that grows in the form of a band on the surface of the film and in the interior thereof.

In particular, nickel reacts with oxygen so that NiOx abnormally grows on the surface of the film and in the interior thereof.

In order to prevent the above oxide (NiOx) from abnormally growing, in addition of gettering due to the heat treatment, the nickel added region is etched by a gas in which halogen elements are added to an inactive gas atmosphere after the crystallizing process, so as to selectively remove a film containing a large amount of Ni and P.

It is preferable that the atmosphere containing halogen S elements contains one or plural kinds of gases selected from HCl, HF, HBr, $Cl_2$, $F_2$ and $Br_2$.

In this way, nickel elements are removed to prevent the formation of the oxide which causes a problem.

Also, it is desirable that the semiconductor device is produced such that the oxidizing gas is out of contact with the crystalline silicon film as much as possible through all the processes after the crystallizing process.

In addition, the most characteristic structures of the present invention are listed below.

(1) An insulating film (mask) is selectively provided on the amorphous film, and catalytic elements are added to the film, to thereby form a crystalline film called "lateral growth region".

(2) The above mask is used as it is, and elements having a gettering effect are added to the film, to thereby getter the catalytic elements that remain in the lateral growth region.

(3) The above mask is used as it is, and the nickel added region or the phosphorus added region is removed.

That is, the technique disclosed in Japanese Patent Unexamined Publication No. Hei 8-78329 is utilized in crystallization of the amorphous film, and the insulating film remaining on the crystalline film which has been crystallized is reused as a mask for selectively adding the elements of Group XV. The disclosure of 8-78329 patent is incoporated herein by reference.

Also, the mask is reused when removing the region (nickel added region) containing nickel and phosphorus with high concentration.

Accordingly, the region to which the catalytic elements are added and the region to which elements selected from Group XV are added are made to be the same region.

Also, since the mask insulating film used when adding nickel is reused when adding P ions, there is no necessity of newly providing a mask used in the P-ion adding process. Further, since the mask insulating film used when adding nickel is reused when removing the region (nickel added region) containing nickel and phosphorus with high concentration, there is also no necessity of newly providing a mask used in the nickel added region removing process.

Accordingly, the manufacturing process is simplified, a manufacture yield and through-put are improved, thereby obtaining an economically superior effect.

BRIEF DESCRIPTION OF THE DRAWINGS

These and other objects, features and advantages of this invention will become more fully apparent from the following detailed description taken with the accompanying drawings in which:

FIGS. 7A to 7F are diagrams showing a process of manufacturing a TFT;

DESCRIPTION OF THE PREFERRED EMBODIMENTS

Now, a description will be given in more detail of preferred embodiments of the present invention with reference to the accompanying drawings. However, the present invention is not limited to or by those embodiments.
(First Embodiment)

An example of a manufacturing process until an active layer formed of a crystalline film is formed according to the present invention will be, described with reference to FIGS. 1A to 1D. In this embodiment, nickel is used as catalytic elements, and phosphorus is used as elements for gettering.

First, a substrate 101 is prepared, and an under film 102 formed of a silicon oxide film is formed in thickness of 200 nm on the substrate 101. In this embodiment, a glass substrate is used, but a quartz substrate, a silicon substrate, a ceramic substrate and so on may be used instead of the glass substrate.

Then, an amorphous silicon film 103 is formed in thickness of 10 to 75 nm (preferably 15 to 45 nm) through the plasma CVD method or the low pressure CVD method. An amorphous semiconductor film containing silicon, for example, $Si_xGe_{1-x}$ (0<X<1) may be used besides the amorphous silicon film.

Subsequently, a process of crystallizing the amorphous silicon film 103 is conducted. The detailed conditions are disclosed in Japanese Patent Unexamined Publication No. Hei 8-78329, the disclosure of which is incorporated herein by reference.

Figure 1A:
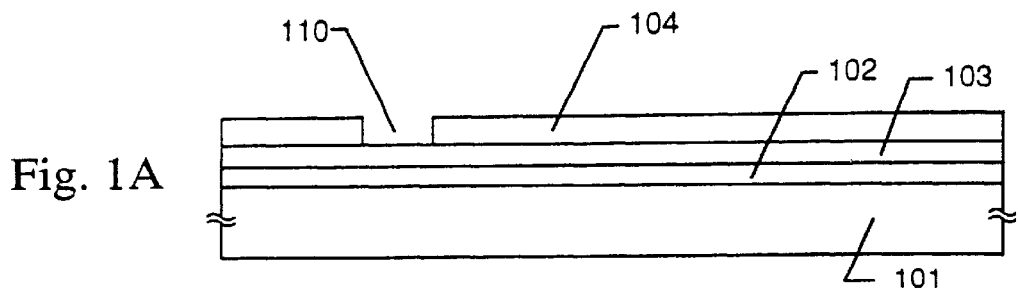
FIGS. 1A to 1D are diagrams showing a process of forming a crystalline film.

First, a mask insulating film 104 formed of a silicon oxide film is formed in thickness of 50 to 150 nm on the amorphous silicon 103. Then, the mask insulating film 104 is patterned to provide an opening 110 in a region to which nickel will be added later (FIG. 1A).

Subsequently, UV rays is irradiated on the film in an oxygen atmosphere to form an extremely thin silicon oxide film (not shown) on the surface of the amorphous film which is exposed from a bottom of the opening 110. This process has an effect of improving wettability when coating a solution in a succeeding step. Then, a nickel acetate solution containing nickel of 100 ppm by weight conversion is dropped to form a thin nickel contained layer 111 through the spin coating method (FIG. 1B).

Figure 1B:
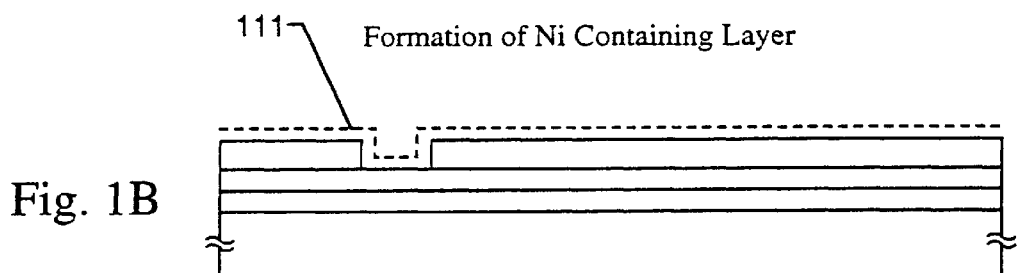
Figure 1C:
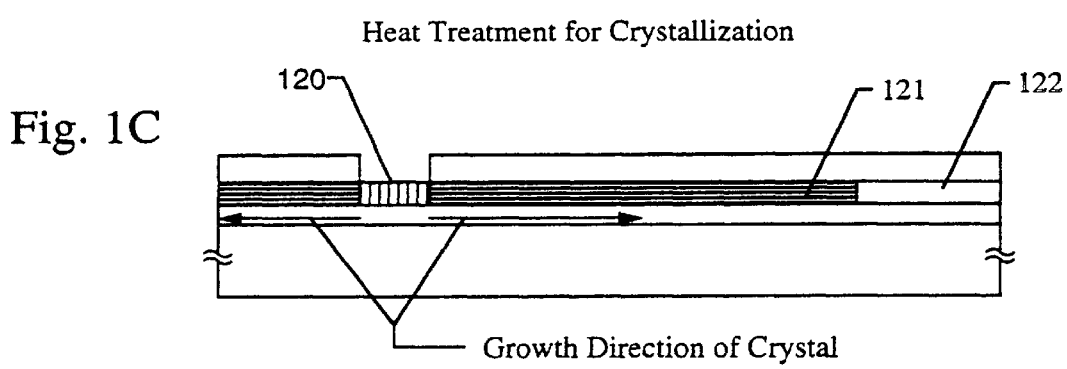

After the state shown in FIG. 1B is obtained, a heat treatment is conducted in a nitrogen or hydrogen atmosphere at a temperature of 500 to 700° C. (representatively 550 to 650° C.) for 4 to 8 hours to crystallize the amorphous silicon film 103 (FIG. 1C), In this situation, the silicon film that has been crystallized is classified into three regions consisting of (1) a nickel added region 120 (crystalline film), (2) a lateral growth region 121 (crystalline film) and (3) a region 122 where lateral growth has not been made (amorphous film). In the present invention, the lateral growth region 121 of (2) is used as an active layer.

In the above way, a lateral growth region 121 formed of the crystalline silicon film is obtained. It has been confirmed through SIMS (secondary ion mass spectroscopy) that nickel remains with the concentration of about $5 \times 10^{18}$ atoms/cm$^3$ in the lateral growth region immediately after crystallization has been made. In the present specification, the concentration of nickel is defined by a minimum value of the measured value through the SIMS analysis.

Subsequently, the mask insulating film 104 used during the nickel adding process is reused as it is, to add P ions for a gettering process. The addition of P ions may be made through the ion plantation method or the plasma doping method.

Those methods are different from each other in that the former is to mass-separate only P ions to add them whereas the latter is to add also the composite ions containing P ions without conducting mass-separation. In this embodiment, the plasma doping method is used, which is advantageous in view of cost performance ratio. In this embodiment, since $PH_3$ (phosphine) is employed as a plasma doping gas, compounds such as $PH_2$ or $PH_3$ are contained in the film in addition to P. However, elements that impedes the gettering effect are not contained in the film.

Figure 1D:
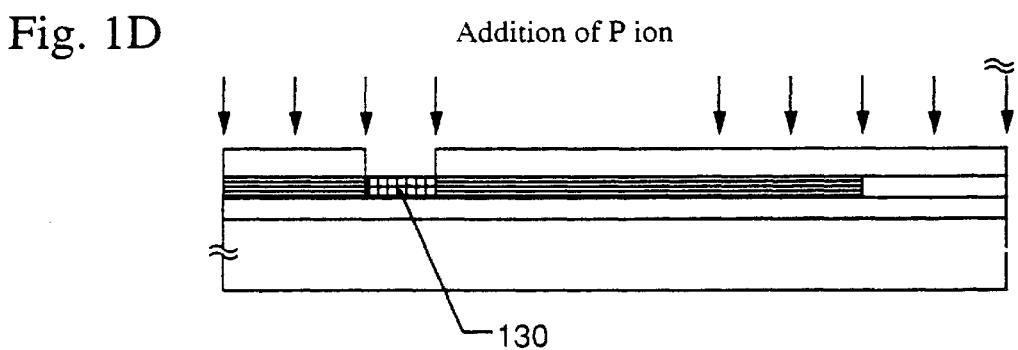

The doping process of this embodiment may be made under the conditions where an acceleration voltage is 5 to 25 kV, and the dose amount is $1 \times 10^{13}$ to $8 \times 10^{15}$ atoms/cm$^2$. With those set values, P ions are added in a region (hereinafter called "phosphorus added region") 130 where P ions are added with the concentration of $5 \times 10^{19}$ to $2 \times 10^{21}$ atoms/cm$^3$ (FIG. 1D).

In the structure of this embodiment, the phosphorus added region 130 and the nickel added region 120 are made to be the same region, In other words, the reason why the above concentration is set is that it is desirable to set the concentration of P ions to be higher than the concentration of nickel (about $1 \times 10^{19}$ to $5 \times 10^{19}$ atoms/cm$^3$) contained in the phosphorus added region 130 by about one digit.

Figure 2A:
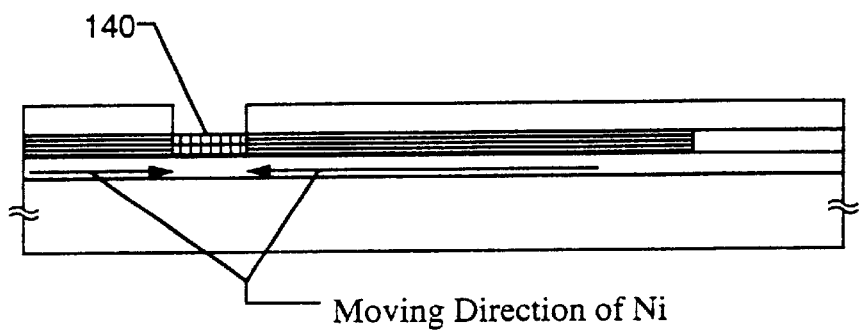
FIGS. 2A to 2C are diagrams showing a process of forming a crystalline film according to a first embodiment of the present invention.

After the P ion adding process has been completed, a heat treatment is conducted in a nitrogen atmosphere at 500 to 700° C. (representatively 600° C.) for 2 to 4 hours so that nickel remaining in the lateral growth region 121 is moved toward the phosphorus added region 130. In this way, the lateral growth region in which the concentration of nickel is reduced by P ions is obtained (FIG. 2A).

In the above way, nickel remaining in the lateral growth region 121 is gettered to the phosphorus added region (also called "nickel added region") 130, whereby nickel is removed or reduced from the lateral growth region 121. According to the SIMS analysis by the present inventors, it has been confirmed that the concentration of nickel contained in the lateral growth region 121 is reduced down to $1 \times 10^{18}$ atoms/cm$^3$ or less (preferably $5 \times 10^{17}$ atoms/cm$^3$ or less).

Figure 5:
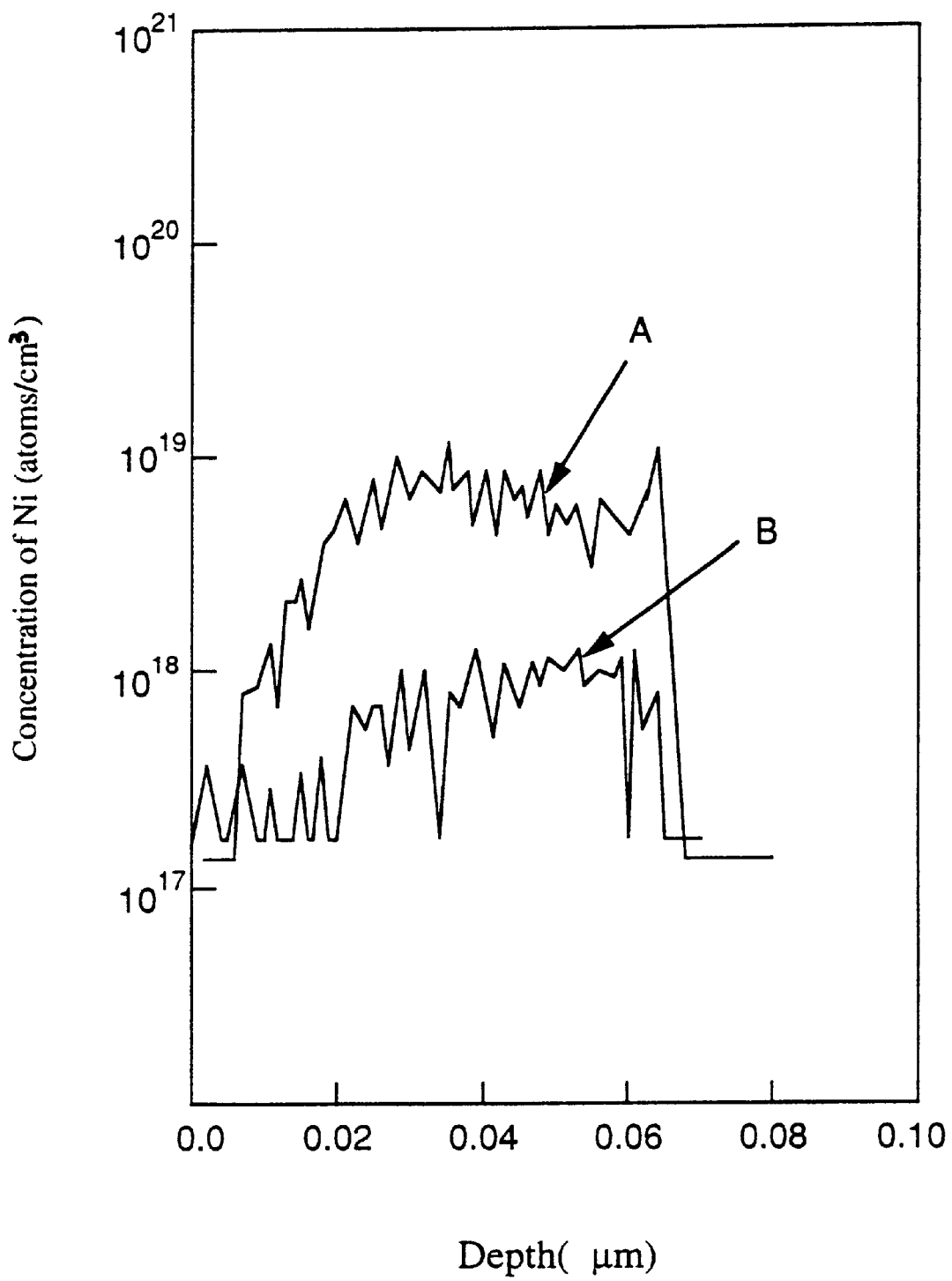
FIG. 5 is a graph showing the concentration of nickel in a crystalline film.

Data shown in FIG. 5 is a representative example of the concentration profile in a depthwise direction of nickel through SIMS analysis. The axis of abscissas indicates the depth, and the axis of ordinates indicates the concentration of nickel. The crystalline silicon film as a sample is the thickness of 50 nm.

In FIG. 5, data indicated by symbol A is the results of measuring the region to which P ions are added, which corresponds to a region indicated by reference numeral 130 in FIG. 1D. Because this region functions as gettering cite, nickel is detected with the concentration of $5 \times 10^{18}$ atoms/cm$^3$ or more.

Also, data indicated by symbol B is the results of measuring the lateral growth region, which corresponds to a region indicated by reference numeral 140 in FIG. 2A. It has been found that nickel remains in lateral growth region with the concentration of $5 \times 10^{18}$ atoms/cm$^3$ in a preliminary experimental stage but is reduced down to $5 \times 10^{17}$ atoms/cm$^3$ or less by the gettering process.

The profile becomes sometimes flat when its depth ranges from 0.0 to 0.02 µm, but this means the lower limit of detection in the current measurement, and it is presumed that, in fact, nickel is reduced to $1 \times 10^{17}$ atoms/cm$^3$ or less.

Through the above processes, the region is doped with P ions, and the heat treatment is conducted on the film so that the concentration of nickel content can be reduced to some degree. However, nickel cannot be sufficiently gettered.

Under the above circumstance, in order to prevent the generation of an oxide by further reducing the concentration of nickel, the phosphorus added region 140 is removed.

In the phosphorus added region 140 is contained a large amount of high-concentration P ions and moved nickel ions.

The etching of phosphorus added region 140 may be performed by the wet etching using buffer hydrofluoric acid (or hydrofluoric acid etchant) or the dry etching.

In this example, Cl is selected as halogen elements contained in an inactive gas atmosphere, and HCl is used as its introducing method. As a gas other than HCl, one or plural kinds of gases selected from HF, HBr, $Cl_2$, $F_2$ and $Br_2$ can be used. Also, in general, hydride of halogen can be used.

The content (volume content) of those gases in an inactive gas atmosphere is preferably set to be 0.25 to 5% in the case of HF, 1 to 15% in the case of HBr, 0.25 to 5% in the case of $Cl_2$, 0.125 to 2.5% in the case of $F_2$, and 0.5 to 10% in the case of $Br_2$.

If the concentration is less than the above range, no significant effect can be obtained. Also, if the concentration is more than the above range, the surface of the silicon surface gets rough.

In this example, a heat treatment is conducted in a nitrogen atmosphere containing HCl of 1% at 650° C. for 6 hours.

Figure 2B:
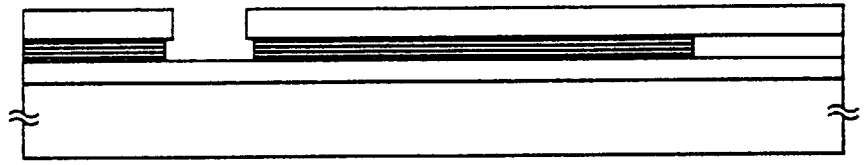

This process makes it possible to remove the nickel added region, and halogen elements in the gas and nickel elements are bonded together, and therefore the concentration of nickel elements can be reduced. The same effect can be obtained even in the case of using other metal elements (FIG. 2B).

After the above removing process has been completed, the mask insulating film 104 is removed, and the silicon film consisting of the crystalline film and the amorphous film is patterned. In this situation, at least a portion which will form a channel forming region is made up of a lateral growth region 121.

Figure 2C:
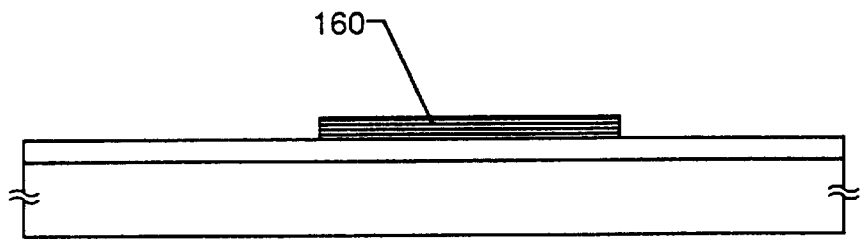

In the above way, an active layer (island-like semiconductor layer) 160 made up of only the lateral growth region 121 is completed. The structure of this embodiment makes it possible to obtain a crystalline silicon film in which nickel that promotes crystallization is remarkably reduced (FIG. 2C).

Also, since the mask insulating film used when adding nickel is reused when adding P ions, there is no necessity of newly providing a mask used in the P ion adding process. Accordingly, the manufacturing process is simplified, a manufacture yield and through-put are improved, thereby obtaining an economically superior effect.

(Second Embodiment)

Figure 3A:
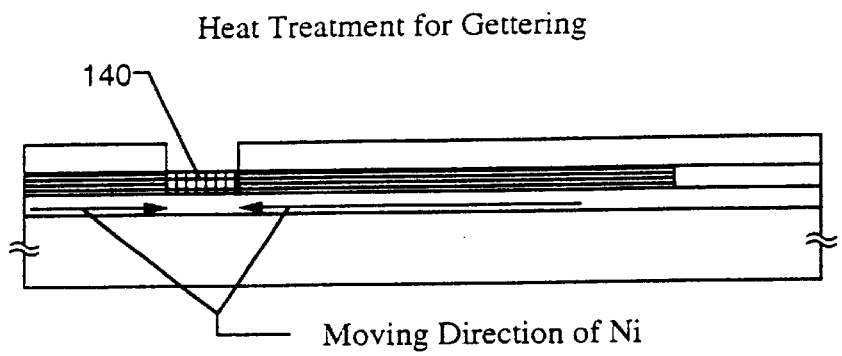
FIGS. 3A to 3C are diagrams showing a process of forming a crystalline film according to a second embodiment of the present invention.

This embodiment is completely identical with the first embodiment in processes of from the P ion adding process to the heating process (FIG. 2A). Also, FIG. 3A is identical with FIG. 2A.

In the first embodiment, because HCl added gas is used as gas containing halogen elements in the inactive gas atmosphere, the silicon film existing under the insulating film mask is also removed as shown in FIG. 2B.

Therefore, in this embodiment, the silicon film in the nickel added region is etched through wet etching using buffer hydrofluoric acid (or hydrofluoric acid etchant) or dry etching as another process. Thereafter, using HCl added gas as gas containing halogen elements in an oxidizing gas atmosphere, a gettering process is made from the etched section of the silicon film.

In this example, Cl is selected as halogen elements, and HCl is used as its introducing method. As a gas other than HCl, one or plural kinds of gases selected from HF, HBr, $Cl_2$, $F_2$ and $Br_2$ can be used. Also, in general, hydride of halogen can be used.

The content (volume content) of those gases in an oxidizing gas atmosphere is preferably set to be 0.25 to 5% in HF, 1 to 15% in HBr, 0.25 to 5% in $Cl_2$, 0.125 to 2.5 in $F_2$, and 0.5 to 10% in $Br_2$.

In this example, a heat treatment is conducted in an oxygen atmosphere containing HCl of 3% at 650° C. for 12 hours.

Also, in this embodiment, since nickel elements are gettered to the interior of the oxide film 150 formed in the etched section of the silicon film, the concentration of nickel in the oxide film 150 becomes higher than that in other regions.

Figure 3B:
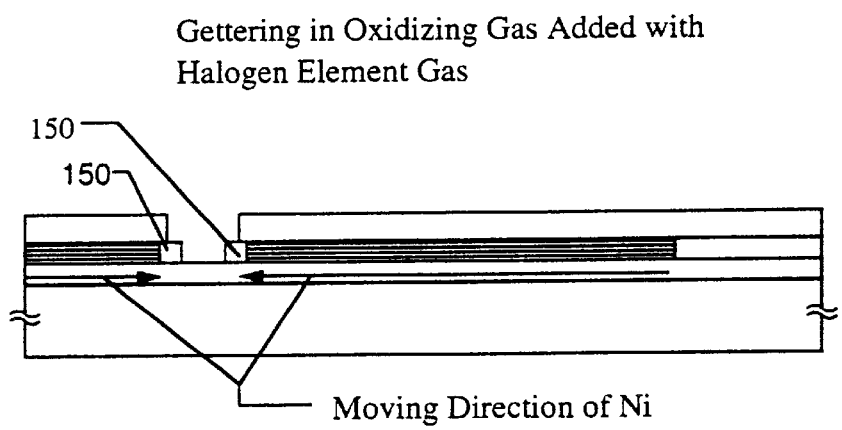

Further, it has been observed that nickel elements tend to be higher in the vicinity of a boundary between the silicon film 105 and
the oxide film 150. It is presumed that this is because the region which is mainly gettered is at the oxide film side in the vicinity of the boundary between the silicon film and the oxide film. Also, it is presumed that the reason why gettering progresses in the vicinity of the boundary is that a stress or a defect exists in the vicinity of the boundary (FIG. 3B).

Then, the oxide film 150 containing nickel with a high concentration is removed. The removal of this oxide film is conducted through wet etching using buffer hydrofluoric acid (or hydrofluoric acid etchant) or dry etching.

This process makes it possible to reduce the concentration of nickel elements to $\frac{1}{10}$ or less of the initial concentration at the maximum. This means that nickel elements can be reduced to $\frac{1}{10}$ or less in comparison with a case in which gettering due to halogen elements is not conducted. The same effect can be obtained even in the case of using other metal elements.

After the above removing process has been completed, the mask insulating film 104 is removed, and the silicon film consisting of the crystalline film and the amorphous film is patterned. In this situation, at least a portion which will form a channel forming region is made up of a lateral growth region 121.

Figure 3C:
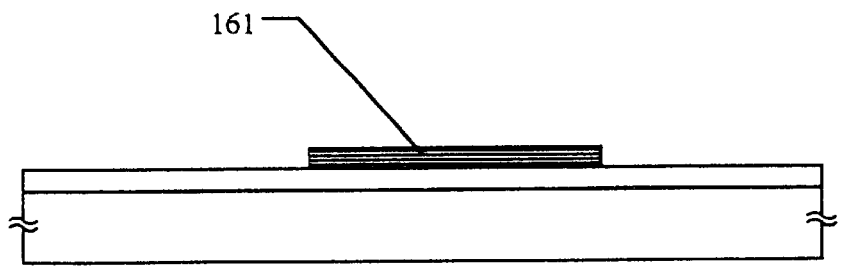

In the above way, a crystalline silicon film 161 in which the concentration of nickel content is reduced can be obtained as shown in FIG. 3C.

Also, since the mask insulating film used when adding nickel is reused when adding P ions, removing the phosphorus added region and removing the oxide film as in the first embodiment, the manufacturing process is simplified, a manufacture yield and through-put are improved, thereby obtaining an economically superior effect.

Third Embodiment

Figure 4A:
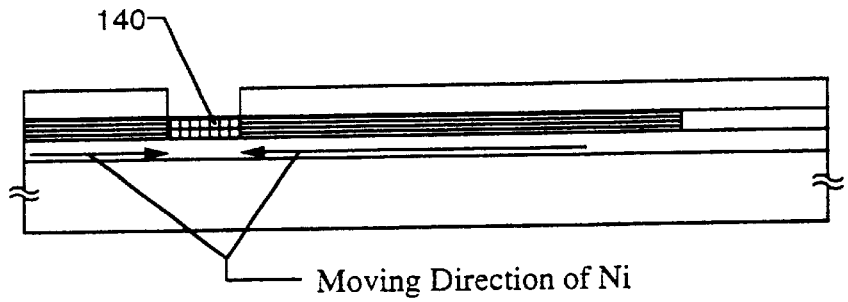
FIGS. 4A to 4E are diagrams showing a process of forming a crystalline film according to a third embodiment of the present invention.

This embodiment is completely identical with the first embodiment in processes of from the P ion adding process to the heating process (FIG. 2A) except that a quartz substrate is used as a substrate 100. Also, FIG. 4A corresponds to FIG. 2A.

In the second embodiment, because HCl added gas is used as gas containing halogen elements in the oxidizing gas atmosphere, an oxide is liable to abnormally grow.

Accordingly, in this embodiment, as another process, after the phosphorus added region is removed, the insulating film mask is removed, and patterning is made to obtain an island-like silicon film. Then, after a silicon oxide film 180 is laminated on the entire surface of the film to cover the island-like silicon film, a heat treatment is conducted under an oxidizing atmosphere in which halogen elements are added to thereby smooth the surface of the insulating film. Hereinafter, this process will be described in more detail.

Figure 4B:
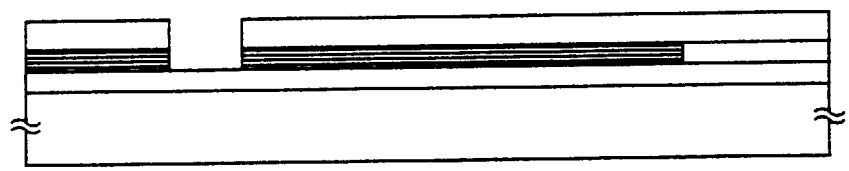

First, the silicon film in the phosphorus added region 140 is etched through wet etching using buffer hydrofluoric acid (or hydrofluoric acid etchant) or dry etching as in the second embodiment (FIG. 4B).

Figure 4C:

Then, the mask insulating film 104 is removed and the silicon film consisting of the crystalline film and the amorphous film is patterned to form an island-like semiconductor layer (active layer) 162 (FIG. 4C).

Figure 4D:
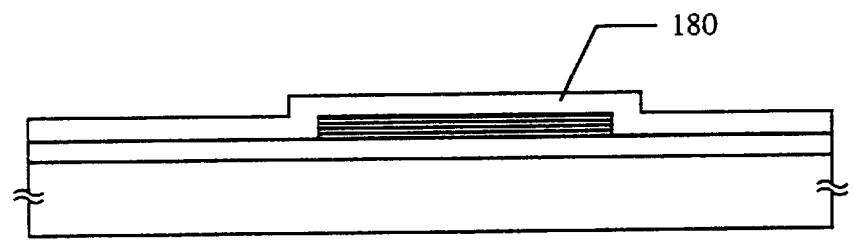

Thereafter, a silicon oxide film 180 is formed in thickness of 100 nm through the plasma CVD method or the low pressure CVD method (FIG. 4D).

Then, a heat treatment is conducted under an oxidizing atmosphere to which halogen elements are added to form an oxide film 181.

In this example, a heat treatment is conducted in an oxygen atmosphere in which HCl of 3% is contained at 950° C. for 35 minutes.

Figure 4E:
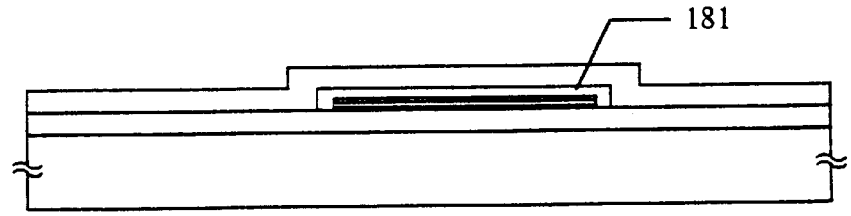

Since an excellent oxide film 181 is obtained between the silicon oxide film formed through the CVD method and the crystalline silicon film through the above process, if a thin film transistor is formed with the silicon oxide film 181 as the gate insulating film as it is, the electric characteristic is improved (FIG. 4E).

Also, thereafter the formed silicon oxide films 180 and 181 may be removed. This process makes it possible to obtain a more excellent crystalline silicon film which is low in the concentration of nickel content.

Further, since the mask insulating film used when adding nickel is reused when adding P ions and removing the phosphorus added region as in the first embodiment, the manufacturing process is simplified, a manufacture yield and through-put are improved, thereby obtaining an economically superior effect.

(Fourth Embodiment)

In this embodiment, an example of a process of producing a CMOS circuit in which an N-channel TFT and a P-channel TFT are complementally combined together will be described.

Figure 6A:
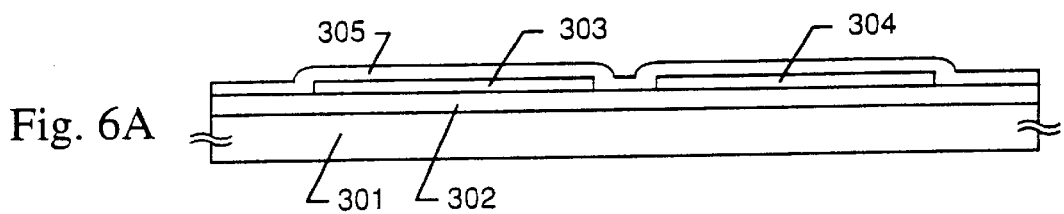
FIGS. 6A to 6E are diagrams showing a process of manufacturing a TFT.

In FIG. 6A, reference numeral 301 denotes a glass substrate, 302 is an under film; 303 is an active layer of an N-channel TFT; and 304 is an active layer of a P-channel TFT. The active layers 303 and 304 are produced according to the manufacturing process described in the first to third embodiments.

Then, a silicon oxide film is formed in thickness of 150 nm through the plasma CVD method or the low pressure CVD method to form a gate insulating film 305 (FIG. 6A).

Thereafter, a metal film mainly containing aluminum is formed (not shown), and an original of a gate electrode which will be formed later is formed by patterning. Then, the technique disclosed in Japanese Patent Unexamined Publication No. Hei 7-135318 by the present inventors is employed. The disclosure of this patent is incorprated herein by reference. The use of the technique disclosed in this publication allows porous anodic oxide films 306 and 307, fine anodic oxide films 308, 309 and gate electrodes 310, 311 to be formed.

Figure 6B:
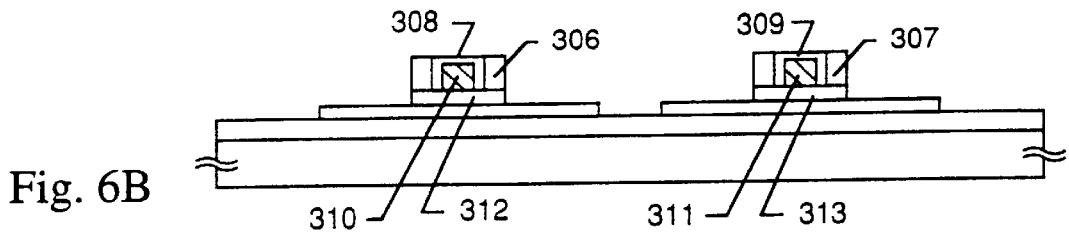

Then, the gate insulating film 305 is etched with the gate electrodes 310, 311 and the porous anodic oxide films 306, 307 as masks to form gate insulating films 312 and 313. Thereafter, the porous anodic oxide films 306 and 307 are removed. Through this process, end portions of the gate insulating films 312 and 313 are exposed (FIG. 6B).

Thereafter, impurity ions chat give N-type are added twice to the film through the ion implantation method or the plasma doping method. In this embodiment, the first impurity addition is made at a high acceleration voltage to form an n⁻ region.

In this situation, since the acceleration voltage is high, the impurity ions are added to not only the exposed surface of the active layer but also a portion under an exposed end portion of the gate insulating film. The dose amount is set in such a manner that the n⁻ region will become an LDD region (the concentration of impurities is about $1 \times 10^{18}$ to $1 \times 10^{19}$ atoms/cm³) later.

Further, the second impurity addition is conducted at a low acceleration voltage to form an n⁺ region. In this situation, since the acceleration voltage is low, the gate insulating film functions as a mask. Also, since the n⁺ region becomes source/drain regions later, the sheet resistivity is adjusted so as to be 500 Ω or less (preferably 300 Ω or less).

Figure 6C:
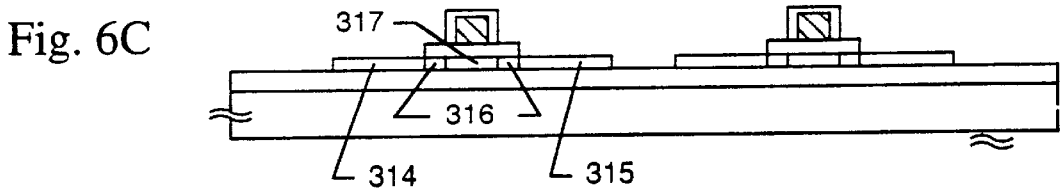

This process allows a source region 314 of the N-channel TFT, a drain region 315, a low-concentration impurity region 316 and a channel forming region 317 to be formed. In this situation, the active layer of the P-channel TFT is in the same state as the active layer of the N-channel TFT (FIG. 6C).

Subsequently, a resist mask 318 is provided so as to cover the N-channel TFT to add impurity ions that give P-type. This process is conducted twice as in the above-described impurity adding process. In this case, since it is necessary to revert N-type to P-type, the impurity ions must be added about 2 to 3 times as much as those in the above-described N-channel TFT.

Figure 6D:
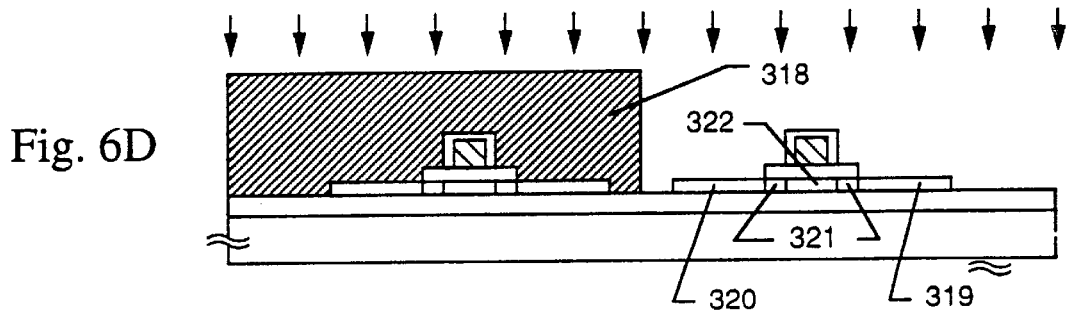

In this way, a source region 319 of the P-channel TFT, a drain region 320, a low-concentration impurity region 321 and a channel forming region 322 are formed (FIG. 6D).

After the active layer has been thus completed, the impurity ions are activated and damages caused when adding ions are restored through furnace annealing, laser annealing or lamp annealing.

Then, an interlayer insulating film 323 is formed in thickness of 500 nm. The interlayer insulating film 323 may be formed of any one of a silicon oxide film, a silicon nitride film, silicon oxide nitride film and an organic resin film, or a lamination film thereof.

Figure 6E:
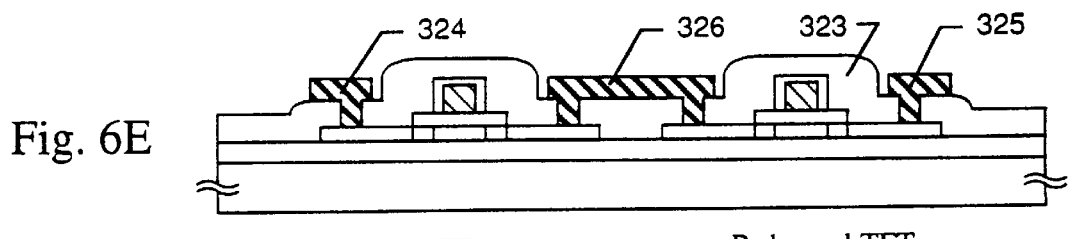

Thereafter, contact holes are defined to form source wirings 324, 325 and a drain wiring 326 to obtain a state shown in FIG. 6E. Finally, a heat treatment is conducted in a hydrogen atmosphere so that the entire product is hydrogenated to complete a CMOS circuit.

The CMOS circuit of this embodiment is also called "invertor circuit, which is a basic circuit that constitutes a semiconductor circuit. The combination of the invertor circuits of this type can constitute a basic logic circuit such as a NAND circuit or a NOR circuit or more complicated logic circuits.

Also, because the TFT thus formed includes few catalytic elements such as nickel in the channel forming regions 317 and 322 and a junction portion of both ends thereof, there is no case in which the electric characteristic is adversely affected by such catalytic elements. Accordingly, TFTs, CMOS circuits and also semiconductor circuits which are high in reliability can be structured.

(Fifth Embodiment)

In this embodiment, a case in which the present invention is applied to a reverse stagger TFT as an example of the application of a bottom gate type TFT will be described.

In FIG. 7A, reference numeral 401 denotes a glass substrate; 402 is an under film; 403 is a gate electrode made of conductive material; 404 is a gate insulating film; 405 is an amorphous silicon film; and 406 is an insulating film which will form a mask in a subsequent catalytic element adding process. Also, an opening 407 is defined in the mask insulating film 406.

Since a heat treatment is conducted at 500 to 700° C. in the case where the following crystallizing process and the gettering process are conducted by furnace annealing, it is necessary to use a material that withstands the above temperature as the gate electrode 403. It is needless to say that the selectivity of an available material is increased if laser annealing or lamp annealing is applied.

A layer 408 containing catalytic elements (also in this embodiment, nickel is exemplified) is formed through the spin coating method as in the first embodiment (FIG. 7A).

Then, a heat treatment for crystallization is conducted to for a lateral growth region 409 formed of a crystalline silicon film. Reference numeral 410 denotes a nickel added region made of the crystalline silicon film; and 411 is an amorphous region which has not been crystallized (FIG. 7B).

Subsequently, elements for gettering nickel (in this embodiment, phosphorus is exemplified similarly) are added. In this situation, P ions are added to only the nickel added region 410 to form a phosphorus added region 412 (FIG. 7C).

Thereafter, a heat treatment is conducted for gettering, and nickel is moved toward the phosphorus added region 412 to conduct gettering. In this way, there is formed a lateral growth region 413 in which nickel is removed or reduced down to $5 \times 10^{17}$ atoms/cm³ or less (FIG. 7D).

Then, the phosphorus added region is removed through the method implemented in the first to third embodiments.

Subsequently, the insulating film 406 which has been used as a mask is removed, and the lateral growth region 413 is patterned to form an active layer 414. Then, a channel stopper 415 is formed on the active layer 414 by patterning the silicon nitride film (FIG. 7E).

After the state of FIG. 7E is obtained, a crystalline silicon film that gives N-type is formed and then patterned to form a source region 416 and a drain region 417. Further, a source wiring 418 and a drain wiring 419 are formed. Then, the entire product is finally hydrolyzed to complete a reverse stagger TFT shown in FIG. 7F.

In this way, the present invention is applicable to the insulating gate type semiconductor device regardless of its structure.

(Sixth Embodiment)

This embodiment shows an example in which an electro-optic device is made up of TFTs to which the present invention is applied. In this embodiment, the present invention is applied to an active matrix liquid crystal display device. Otherwise, the present invention is applicable to an active matrix EL display device, EC display device and so on.

Figure 8:
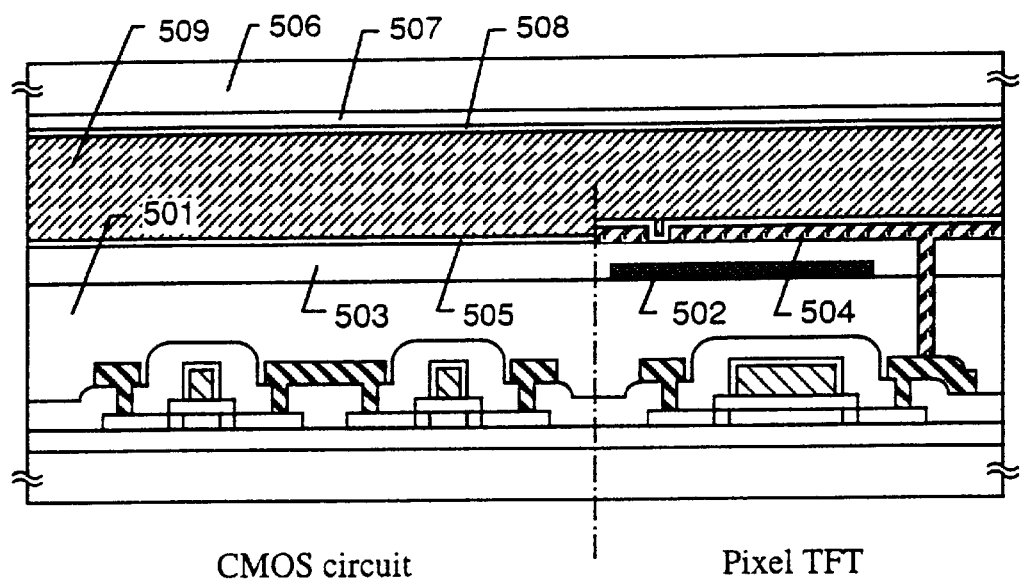
FIG. 8 is a cross-sectional view showing a liquid crystal display device.

What is shown in FIG. 8 is a simplified cross-sectional view of an active matrix liquid crystal display device, in which a CMOS circuit is shown in a region constituting a driver circuit and a logic circuit, and a pixel TFT is shown in a region constituting a pixel matrix circuit.

Since a description has already been made of the structure of the CMOS circuit (TFT structure), only parts necessary for this embodiment will be described.

First, a CMOS circuit on the left side of FIG. 8 is completed according to the process of manufacturing the CMOS circuit described in the fourth embodiment. In this situation, the structure of the pixel TFT is basically identical with that of the TFT that constitutes the CMOS circuit. Only the pixel TFT can be modified to a multi-gate structure or changed in the length of an LDD region. However, in this case, an implementor may change the structure as occasions demand.

An interlayer insulating film 501 which is formed of an organic resin film is disposed on the CMOS circuit, and a black mask 502 is disposed on the interlayer insulating film 501. In this embodiment, the black mask 502 is disposed only above the pixel matrix circuit, but may be disposed above the CMOS circuit.

An interlayer insulating film 503 is again disposed on the black mask 502, and a contact hole is provided so that a pixel electrode 504 is disposed therein. The pixel electrode 504 may be formed of a reflection film such as an aluminum film in case of a reflection type display device, and a transparent conductive film such as ITO in case of a transmission type display device. Then, an orientation film 505 is disposed on a uppermost layer to structure an active matrix substrate. The active matrix substrate is directed to a substrate at a side where the TFT is disposed.

Also, reference numeral 506 denotes an opposed substrate; 507 is an opposed electrode formed of a transparent conductive film; and 508 is an orientation film on an opposite side. An active matrix liquid crystal display device in which a liquid crystal layer 509 is sandwiched between the opposed substrate thus structured and the above-mentioned active matrix substrate as shown in FIG. 8 is structured.

Figure 9:
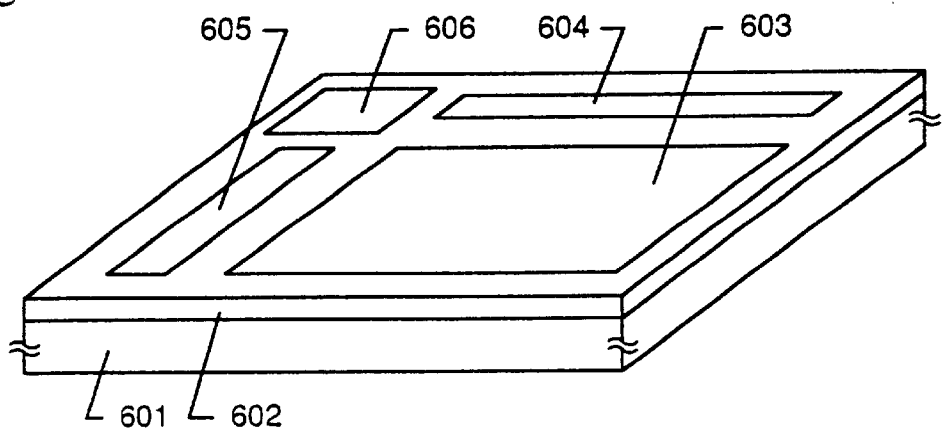
FIG. 9 is a top view showing a liquid crystal display device.

Also, the appearance, of the active matrix liquid crystal display device is simplified and shown in FIG. 9. In FIG. 9, reference numeral 601 denotes a glass substrate; 602 is an under layer; 603 is a pixel matrix circuit; 604 is a source driver circuit; 605 is a gate driver circuit; and 606 is a logic circuit.

The logic circuit 606 includes all of the logic circuits made up of TFTs in a wide sense. In this example, up to now, in order to distinguish from a circuit called "pixel matrix circuit" and "driver circuit", the logic circuit is directed to other circuits.

(Seventh Embodiment)

In this embodiment, applied products using an electro-optic device described in the sixth embodiment will be described with reference to FIGS. 10A to 10E as examples of a semiconductor device to which the present invention is applied. The semiconductor devices using the present invention are, for example, a video camera, a still camera, a head mount display, a car navigation, a personal computer, a portable information terminal (a mobile computer, a portable telephone, etc.), etc.

Figure 10A:
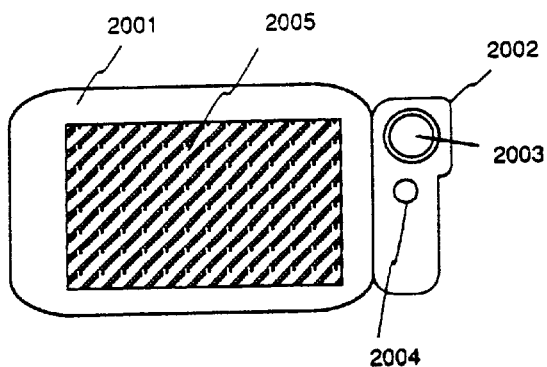
FIGS. 10A to 10E are diagrams showing examples of an electronic device.

FIG. 10A shows a mobile computer which is made up of a main body 2001, a camera section 2002, an image receiver 2003, an operation switch 2004, and a display device 2005. The present invention can be applied to the display device 2005.

Figure 10B:
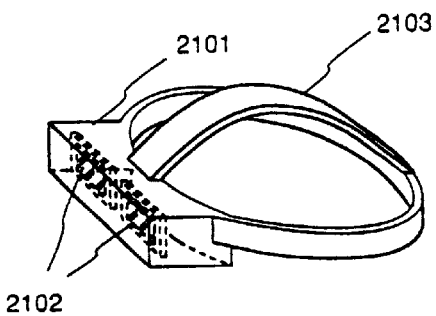

FIG. 10B shows a head mount display which is made up of a main body 2101, a display device 2102, and a band section 2103. The present invention is applied to the display device 2102, to thereby remarkably reduce the price of the device.

Figure 10C:
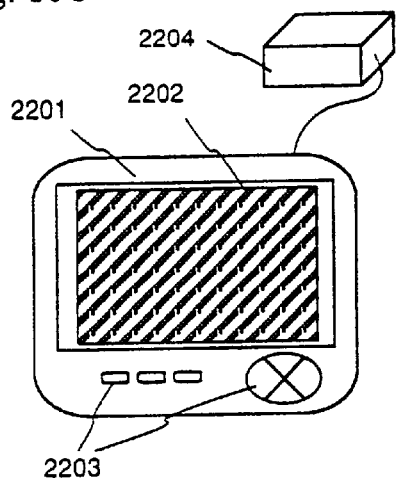

FIG. 10C shows a car navigation system which is made up of a main body 2201, a display device 2202, an operation switch 2203, and an antenna 2204. The present invention can be applied to the display device 2202.

Figure 10D:
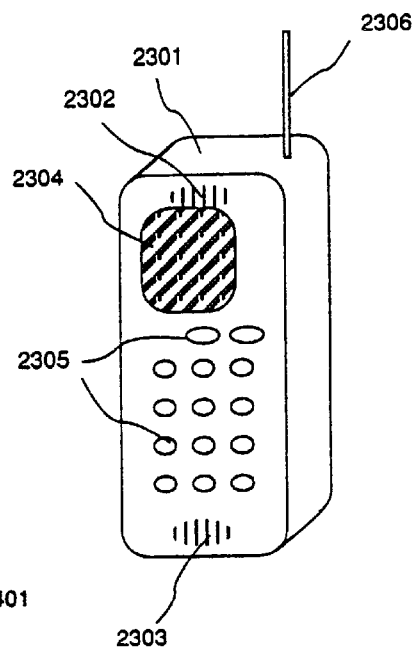

FIG. 10D shows a portable telephone which is made up of a main body 2301, a voice output section 2302, a voice input section 2303, a display device 2304, an operation switch 2305, and an antenna 2306. The present invention can be applied to the display device 2304.

Figure 10E:
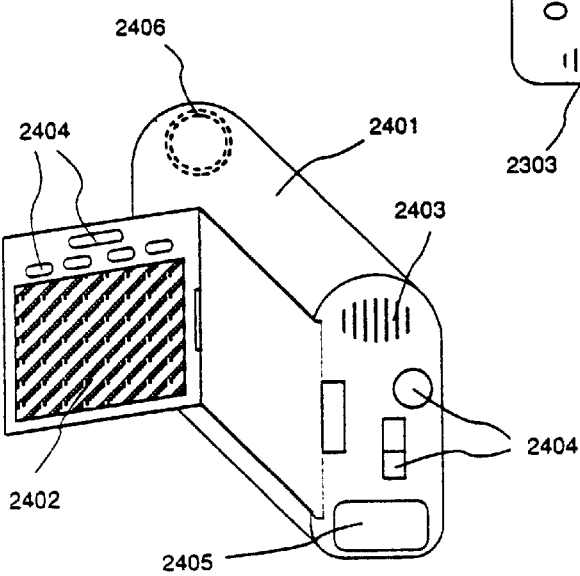

FIG. 10E shows a video camera which is made up of a main body 2401, a display device 2402, a voice input section 2403, an operation switch 2404, a battery 2405, and an image receiver 2406. The present invention can be applied to the display device 2402.

As described above, the present invention is applied extremely widely, and applicable to display medium in any fields.

As is described above, according to the present invention, the catalytic elements can be effectively removed or reduced from the crystalline film obtained using the catalytic elements that promote the crystallization. Also, since this process is conducted at a heat resistant temperature of glass or less, a low-temperature process can be performed.

Also, since the mask used in the catalytic element adding process, the mask used in the process of adding the elements selected from Group XV and the mask used in the process of selectively removing the catalytic element added region are made common, the manufacture process is remarkably simplified. For that reason, through-put, yield and so on are improved with the result that the present invention is economically useful.

In addition, the crystalline film obtained according to the present invention is very excellent in crystallinity due to the effect of the catalytic elements, and its catalytic elements are removed or reduced through the gettering process. Also, because the oxide (NiOx) is prevented from abnormally growing, Ni in the crystalline film is perfectly removed, and oxygen is out of contact with the crystalline film.

As a result, in the case where the crystalline film of the present invention is employed as an active layer of the semiconductor device, there can be obtained a semiconductor device excellent in electric characteristic and high in reliability.

The foregoing description of the preferred embodiments of the invention has been presented for purposes of illustration and description It is not intended to be exhaustive or to limit the invention to the precise form disclosed, and modifications and variations are possible in light of the above teachings or may be acquired from practice of the invention The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A method of manufacturing a semiconductor device comprising the steps of:

forming a semiconductor film on an insulating surface;

forming a mask over said semiconductor film to expose a first portion of said semiconductor film;

selectively adding a metal containing material to the first portion of said semiconductor film by using said mask, said metal being capable of promoting crystallization of said semiconductor film;

heating said semiconductor film to crystallize said semiconductor film wherein said metal diffuses through the semiconductor film during the heating;

selectively introducing ions of an element selected from the Group XV (15) elements of a periodic table into the first portion of the crystallized semiconductor film by using said mask;

heating the crystallized semiconductor film so that said metal contained in a second portion of said semiconductor film below said mask is gettered by said first portion; and patterning the crystallized semiconductor film into at least semiconductor island after the heating of the crystallized semiconductor film, wherein said first portion of the semiconductor film is excluded from said semiconductor island; and fabricating a thin film transistor having said semiconductor island as at least a channel formation region.

2. A method according to claim 1 wherein said semiconductor film comprises amorphous silicon.

3. A method according to claim 1 wherein said semiconductor film comprises amorphous $Si_xGe_{1-x}(0<X<1)$.

4. A method according to claim 1 wherein said element is phosphorus.

5. A method according to claim 1 wherein said ions are introduced by ion doping.

6. A method according to claim 1 wherein said semiconductor device is an active matrix type EL display device.

7. A method according to claim 1 wherein said semiconductor device is a mobile computer.

8. A method according to claim 1 wherein said semiconductor device is a head mount display.

9. A method according to claim 1 wherein said semiconductor device is a navigation system.

10. A method according to claim 1 wherein said semiconductor device is a portable telephone.

11. A method according to claim 1 wherein said semiconductor device is a video camera.

12. A method according to claim 1, wherein said semiconductor device is a mobile computer.

13. A method according to claim 1, wherein said semiconductor device is a head mount display.

14. A method according to claim 1, wherein said semiconductor device is a car navigation system.

15. A method according to claim 1, wherein said semiconductor device is a portable telephone.

16. A method according to claim 1, wherein said semiconductor device is a video camera.

17. A method of manufacturing a semiconductor device comprising the steps of:

forming a semiconductor film on an insulating surface;

forming a mask over said semiconductor film to expose a first portion of said semiconductor film;

selectively adding a metal containing material to the first portion of said semiconductor film by using said mask, said metal being capable of promoting crystallization of said semiconductor film;

heating said semiconductor film to crystallize said semiconductor film wherein said metal diffuses through the semiconductor film during the heating;

selectively introducing ions of an element selected from the Group XV (15) elements of a periodic table into the first portion of the crystallized semiconductor film by using said mask;

heating the crystallized semiconductor film so that said metal contained in a second portion of said semiconductor film below said mask is gettered by said first portion; and patterning the crystallized semiconductor film into at least semiconductor island after the heating of the crystallized semiconductor film, wherein said first portion of the semiconductor film is excluded from said semiconductor island;

forming a gate insulating film on said semiconductor island; and forming a gate electrode on said gate insulating film.

18. A method according to claim 17 wherein said semiconductor film comprises amorphous silicon.

19. A method according to claim 17 wherein said semiconductor film comprises amorphous $Si_xGe_{1-x}(0<X<1)$.

20. A method according to claim 17 wherein said element is phosphorus.

21. A method according to claim 17 wherein said ions are introduced by ion doping.

22. A method according to claim 17 wherein said semiconductor device is an active matrix type EL display device.

23. A method according to claim 17 wherein said semiconductor device is a mobile computer.

24. A method according to claim 17 wherein said semiconductor device is a head mount display.

25. A method according to claim 17 wherein said semiconductor device is a navigation system.

26. A method according to claim 17 wherein said semiconductor device is a portable telephone.

27. A method according to claim 17 wherein said semiconductor device is a video camera.

28. A method according to claim 17, wherein said semiconductor device is a mobile computer.

29. A method according to claim 17, wherein said semiconductor device is a head mount display.

30. A method according to claim 17, wherein said semiconductor device is a car navigation system.

31. A method according to claim 17, wherein said semiconductor device is a portable telephone.

32. A method according to claim 17, wherein said semiconductor device is a video camera.

33. A method of manufacturing a semiconductor device comprising the steps of:

forming a semiconductor film on an insulating surface;

forming a mask over said semiconductor film to expose a first portion of said semiconductor film;

selectively adding a metal containing material to the first portion of said semiconductor film by using said mask, said metal being capable of promoting crystallization of said semiconductor film;

heating said semiconductor film to crystallize said semiconductor film wherein said metal diffuses through the semiconductor film during the heating;

selectively introducing ions of an element selected from the Group XV (15) elements of a periodic table into the first portion of the crystallized semiconductor film by using said mask;

heating the crystallized semiconductor film so that said metal contained in a second portion of said semiconductor film below said mask is gettered by said first portion; and patterning the crystallized semiconductor film into at least semiconductor island after the heating of the crystallized semiconductor film, wherein said first portion of the semiconductor film is excluded from said semiconductor island;

forming a gate insulating film on said semiconductor island;

heating said semiconductor island and said gate insulating film in an oxidizing atmosphere containing hydrogen chloride to oxidize a surface of said semiconductor island; and forming a gate electrode on said gate insulating film.

34. A method according to claim 33 wherein said semiconductor film comprises amorphous silicon.

35. A method according to claim 33 wherein said semiconductor film comprises amorphous $Si_xGe_{1-x}(0<X<1)$.

36. A method according to claim 33 wherein said element is phosphorus.

37. A method according to claim 33 wherein said ions are introduced by ion doping.

38. A method according to claim 33 wherein said semiconductor device is an active matrix type EL display device.

39. A method according to claim 33 wherein said semiconductor device is a mobile computer.

40. A method according to claim 33 wherein said semiconductor device is a head mount display.

41. A method according to claim 33 wherein said semiconductor device is a navigation system.

42. A method according to claim 33 wherein said semiconductor device is a portable telephone.

43. A method according to claim 33 wherein said semiconductor device is a video camera.

44. A method according to claim 1 wherein said metal is selected from the group consisting of Ni, Co, Fe, Pd, Pl, Cu and Au.

45. A method according to claim 1 wherein said thin film transistor has a bottom gate electrode below said semiconductor island.

46. A method according to claim 17 wherein said metal is selected from the group consisting of Ni, Co, Fe, Pd, Pt, Cu and Au.

47. A method according to claim 33 wherein said metal is selected from the group consisting of Ni, Co, Fe, Pd, Pt, Cu and Au.

48. A method according to claim 33, wherein said semiconductor device is a mobile computer.

49. A method according to claim 33, wherein said semiconductor device is a head mount display.

50. A method according to claim 33, wherein said semiconductor device is a car navigation system.

51. A method according to claim 33, wherein said semiconductor device is a portable telephone.

52. A method according to claim 33, wherein said semiconductor device is a video camera.

53. A method of manufacturing a liquid crystal display comprising the steps of:

forming a semiconductor film on an insulating surface;

forming a mask over said semiconductor film to expose a first portion of said semiconductor film;

selectively adding a metal containing material to the first portion of said semiconductor film by using said mask, said metal being capable of promoting crystallization of said semiconductor film;

heating said semiconductor film to crystallize said semiconductor film wherein said metal diffuses through the semiconductor film during the heating;

providing the first portion of the crystallized semiconductor film with a gettering material by using said mask;

heating the crystallized semiconductor film so that said metal contained in a second portion of said semiconductor film below said mask is gettered by said first portion; and patterning the crystallized semiconductor film into at least semiconductor island after the heating of the crystallized semiconductor film; and fabricating a thin film transistor having said semiconductor island as at least a channel formation region.

54. A method according to claim 53, wherein said gettering material comprises an element selected from the group XV(15) elements of a periodic table.

55. A method according to claim 53, wherein the step of providing the first portion of the crystallized semiconductor film with said gettering material is the step of introducing ions of said gettering material.

56. A method of manufacturing an EL display comprising the steps of:

forming a semiconductor film on an insulating surface;

forming a mask over said semiconductor film to expose a first portion of said semiconductor film;

selectively adding a metal containing material to the first portion of said semiconductor film by using said mask, said metal being capable of promoting crystallization of said semiconductor film;

heating said semiconductor film to crystallize said semiconductor film wherein said metal diffuses through the semiconductor film during the heating;

providing the first portion of the crystallized semiconductor film with a gettering material by using said mask;

heating the crystallized semiconductor film so that said metal contained in a second portion of said semiconductor film below said mask is gettered by said first portion; and patterning the crystallized semiconductor film into at least semiconductor island after the heating of the crystallized semiconductor film; and fabricating a thin film transistor having said semiconductor island as at least a channel formation region.

57. A method according to claim 56, wherein said gettering material comprises an element selected from the group XV(15) elements of a periodic table.

58. A method according to claim 56, wherein the step of providing the first portion of the crystallized semiconductor film with said gettering material is the step of introducing ions of said gettering material.

59. A method of manufacturing a mobile computer comprising the steps of:

forming a semiconductor film on an insulating surface;

forming a mask over said semiconductor film to expose a first portion of said semiconductor film;

selectively adding a metal containing material to the first portion of said semiconductor film by using said mask, said metal being capable of promoting crystallization of said semiconductor film;

heating said semiconductor film to crystallize said semiconductor film wherein said metal diffuses through the semiconductor film during the heating;

providing the first portion of the crystallized semiconductor film with a gettering material by using said mask;

heating the crystallized semiconductor film so that said metal contained in a second portion of said semiconductor film below said mask is gettered by said first portion; and patterning the crystallized semiconductor film into at least semiconductor island after the heating of the crystallized semiconductor film; and fabricating a thin film transistor having said semiconductor island as at least a channel formation region.

60. A method according to claim 59, wherein said gettering material comprises an element selected from the group XV(15) elements of a periodic table.

61. A method according to claim 59, wherein the step of providing the first portion of the crystallized semiconductor film with said gettering material is the step of introducing ions of said gettering material.

62. A method of manufacturing a head mount display comprising the steps of:
forming a semiconductor film on an insulating surface;
forming a mask over said semiconductor film to expose a first portion of said semiconductor film;
selectively adding a metal containing material to the first portion of said semiconductor film by using said mask, said metal being capable of promoting crystallization of said semiconductor film;
heating said semiconductor film to crystallize said semiconductor film wherein said metal diffuses through the semiconductor film during the heating;
providing the first portion of the crystallized semiconductor film with a gettering material by using said mask;
heating the crystallized semiconductor film so that said metal contained in a second portion of said semiconductor film below said mask is gettered by said first portion; and
patterning the crystallized semiconductor film into at least semiconductor island after the heating of the crystallized semiconductor film; and
fabricating a thin film transistor having said semiconductor island as at least a channel formation region.

63. A method according to claim 62, wherein said gettering material comprises an element selected from the group XV(15) elements of a periodic table.

64. A method according to claim 62, wherein the step of providing the first portion of the crystallized semiconductor film with said gettering material is the step of introducing ions of said gettering material.

65. A method of manufacturing a car navigation system comprising the steps of:
forming a semiconductor film on an insulating surface;
forming a mask over said semiconductor film to expose a first portion of said semiconductor film;
selectively adding a metal containing material to the first portion of said semiconductor film by using said mask, said metal being capable of promoting crystallization of said semiconductor film;
heating said semiconductor film to crystallize said semiconductor film wherein said metal diffuses through the semiconductor film during the heating;
providing the first portion of the crystallized semiconductor film with a gettering material by using said mask;
heating the crystallized semiconductor film so that said metal contained in a second portion of said semiconductor film below said mask is gettered by said first portion; and
patterning the crystallized semiconductor film into at least semiconductor island after the heating of the crystallized semiconductor film; and
fabricating a thin film transistor having said semiconductor island as at least a channel formation region.

66. A method according to claim 65, wherein said gettering material comprises an element selected from the group XV(15) elements of a periodic table.

67. A method according to claim 65, wherein the step of providing the first portion of the crystallized semiconductor film with said gettering material is the step of introducing ions of said gettering material.

68. A method of manufacturing a portable telephone comprising the steps of:
forming a semiconductor film on an insulating surface;
forming a mask over said semiconductor film to expose a first portion of said semiconductor film:
selectively adding a metal containing material to the first portion of said semiconductor film by using said mask, said metal being capable of promoting crystallization of said semiconductor film;
heating said semiconductor film to crystallize said semiconductor film wherein said metal diffuses through the semiconductor film during the heating;
providing the first portion of the crystallized semiconductor film with a gettering material by using said mask;
heating the crystallized semiconductor film so that said metal contained in a second portion of said semiconductor film below said mask is gettered by said first portion; and
patterning the crystallized semiconductor film into at least semiconductor island after the heating of the crystallized semiconductor film; and
fabricating a thin film transistor having said semiconductor island as at least a channel formation region.

69. A method according to claim 68, wherein said gettering material comprises an element selected from the group XV(15) elements of a periodic table.

70. A method according to claim 68, wherein the step of providing the first portion of the crystallized semiconductor film with said gettering material is the step of introducing ions of said gettering material.

71. A method of manufacturing a video camera comprising the steps of:
forming a semiconductor film on an insulating surface;
forming a mask over said semiconductor film to expose a first portion of said semiconductor film;
selectively adding a metal containing material to the first portion of said semiconductor film by using said mask, said metal being capable of promoting crystallization of said semiconductor film;
heating said semiconductor film to crystallize said semiconductor film wherein said metal diffuses through the semiconductor film during the heating;
providing the first portion of the crystallized semiconductor film with a gettering material by using said mask;
heating the crystallized semiconductor film so that said metal contained in a second portion of said semiconductor film below said mask is gettered by said first portion; and
patterning the crystallized semiconductor film into at least semiconductor island after the heating of the crystallized semiconductor film; and
fabricating a thin film transistor having said semiconductor island as at least a channel formation region.

72. A method according to claim 71, wherein said gettering material comprises an element selected from the group XV(15) elements of a periodic table.

73. A method according to claim 71, wherein the step of providing the first portion of the crystallized semiconductor film with said gettering material is the step of introducing ions of said gettering material.

* * * * *